United States Patent
Oikawa

(10) Patent No.: US 11,094,566 B2
(45) Date of Patent: Aug. 17, 2021

(54) SUBSTRATE HEATING APPARATUS INCLUDING HEATER UNDER SUBSTRATE SUPPORT AND SUBSTRATE PROCESSING APPARATUS USING THE SAME

(71) Applicant: Tokyo Electron Limited, Tokyo (JP)

(72) Inventor: Satoshi Oikawa, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 232 days.

(21) Appl. No.: 16/358,828

(22) Filed: Mar. 20, 2019

(65) Prior Publication Data

US 2019/0295867 A1 Sep. 26, 2019

(30) Foreign Application Priority Data

Mar. 23, 2018 (JP) .............................. JP2018-057017

(51) Int. Cl.
*H01L 21/67* (2006.01)
*H01L 21/673* (2006.01)

(52) U.S. Cl.
CPC .. *H01L 21/67109* (2013.01); *H01L 21/67313* (2013.01)

(58) Field of Classification Search
CPC ......... H01L 21/67109; H01L 21/67313; H01L 21/67103; H01L 21/6732
See application file for complete search history.

(56) References Cited

U.S. PATENT DOCUMENTS

| | | | | |
|---|---|---|---|---|
| 5,886,864 A | * | 3/1999 | Dvorsky | ........... H01L 21/67109 |
| | | | | 361/234 |
| 2014/0072924 A1 | * | 3/2014 | Kaneko | ............... F27B 17/0025 |
| | | | | 432/198 |
| 2018/0122659 A1 | * | 5/2018 | Tsuchida | ........... H01L 21/68785 |

FOREIGN PATENT DOCUMENTS

| | | |
|---|---|---|
| JP | H02-218117 A | 8/1990 |
| JP | 2002-043226 A | 2/2002 |
| JP | 2004-031846 A | 1/2004 |
| JP | 2004-119510 A | 4/2004 |
| JP | 2012-253222 A | 12/2012 |
| TW | 523835 B | 3/2003 |
| TW | M247808 U | 10/2004 |

* cited by examiner

*Primary Examiner* — John P. Dulka
(74) *Attorney, Agent, or Firm* — Abelman, Frayne & Schwab

(57) ABSTRACT

A substrate heating apparatus includes: a substrate support configured to substantially horizontally support a substrate; a heater provided below the substrate support substantially parallel to the substrate, and having a predetermined planar shape; and a side portion extending downward from an outer peripheral portion of the heater.

13 Claims, 3 Drawing Sheets

SUBSTRATE HEATING APPARATUS INCLUDING HEATER UNDER SUBSTRATE SUPPORT AND SUBSTRATE PROCESSING APPARATUS USING THE SAME

CROSS-REFERENCE TO RELATED APPLICATIONS

This application is based on and claims priority from Japanese Patent Application No. 2018-057017, filed on Mar. 23, 2018, with the Japan Patent Office, the disclosure of which is incorporated herein in its entirety by reference.

TECHNICAL FIELD

The present disclosure relates to a substrate heating apparatus and a substrate processing apparatus using the same.

BACKGROUND

In the related art, there is known a heat treatment apparatus furnace including a heating furnace body having an open upper end, a heating unit installed inside the heating furnace body, and a reaction tube accommodated in the heating furnace body and made of a single tube, in which the heating unit includes a linear heating element arranged so as to surround the periphery of the reaction tube, a spiral heating element arranged around the narrowed portion of the upper portion of the reaction tube, a zigzag heating element arranged in the upper portion of the straight body of the reaction tube, a flat spiral heating element arranged in the lower portion of the straight body of the reaction tube, and a planar heating element disposed at the upper part of the straight body part of the reaction tube, a spiral heating element disposed at the lower part of the straight body part of the reaction tube, and a planar heating element disposed below a processing target substrate support member inside the reaction pipe (see, e.g., Japanese Patent Laid-Open Publication No. 2004-119510).

In Japanese Patent Laid-Open Publication No. 2004-119510, a heat reflector is further disposed under the planar heating element such that heat generated downward by the planar heating element is reflected upward so as to prevent heat from being dissipated downward.

SUMMARY

A substrate heating apparatus according to an aspect of the present disclosure includes a substrate support configured to support a substrate substantially horizontally, a heater provided below the substrate support substantially parallel to the substrate, and having a predetermined planar shape, and a side portion extending downward from the outer peripheral portion of the heater.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part of the present disclosure. The illustrative embodiments described in the detailed description, drawing, and claims are not meant to be in any way limiting. Other embodiments may be utilized, and other changes may be made without departing from the spirit or the scope of the subject matter presented here.

Figure 1:
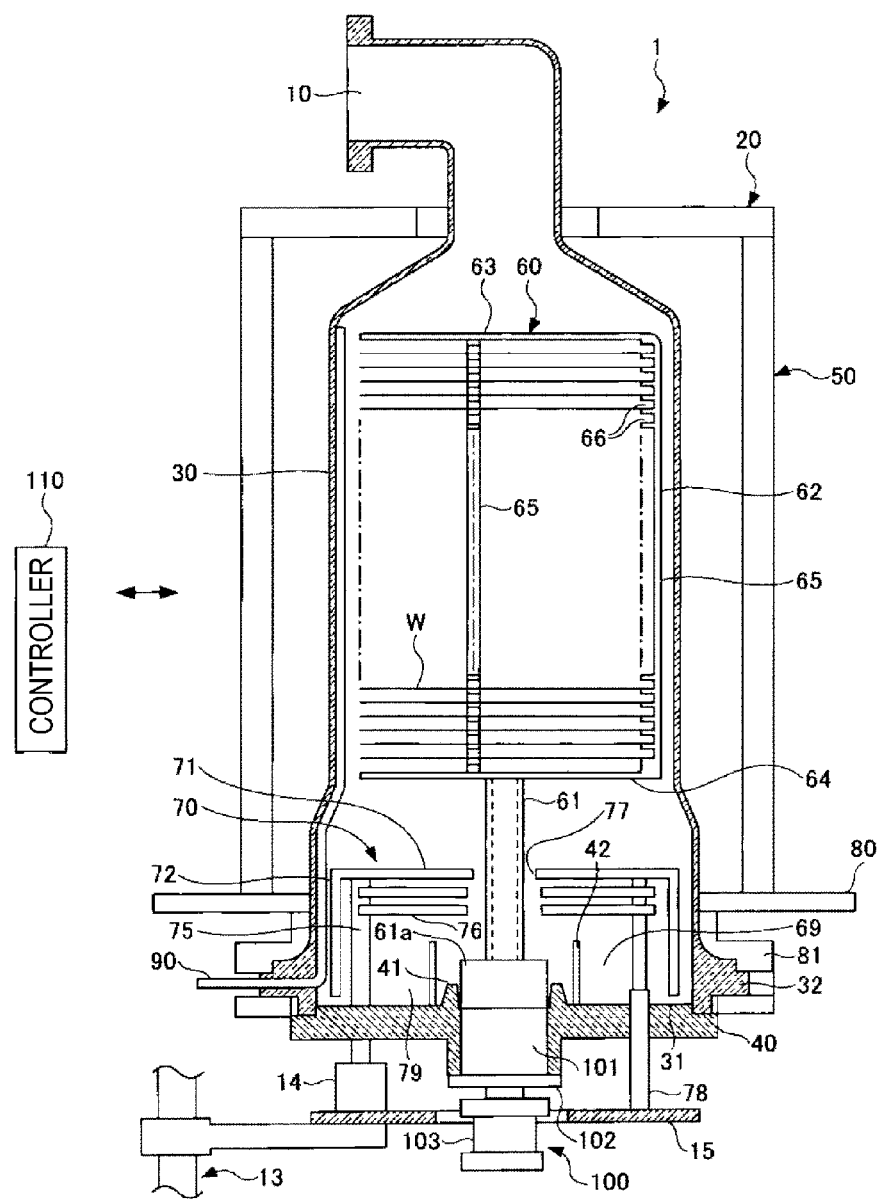
FIG. 1 is a cross-sectional view illustrating an exemplary substrate heating apparatus and substrate processing apparatus according to an embodiment of the present disclosure.

FIG. 1 is a cross-sectional view illustrating an exemplary substrate heating apparatus and substrate processing apparatus according to an embodiment of the present disclosure. The substrate heating apparatus according to the present embodiment is applicable to various substrate processing apparatuses that heat a substrate. In the present embodiment, however, descriptions will be made on an example in which the substrate heating apparatus according to the present embodiment is applied to a vertical heat treatment apparatus 1 in which a plurality of substrates is horizontally placed at a predetermined interval in the longitudinal direction (vertical direction) and heated. That is, an example in which the substrate processing apparatus according to the present embodiment is configured as the vertical thermal processing apparatus 1 will be described.

In FIG. 1, the vertical heat treatment apparatus 1 includes a vertical heat treatment furnace 20 configured to accommodate a substrate such as a semiconductor wafer W (hereinafter, simply referred to as a "wafer W") and perform a predetermined processing such as a CVD processing on the substrate. The heat treatment furnace 20 includes a reaction tube 30 which is a vertically elongated processing container of which the lower portion is opened as a furnace opening 31, a lid 40 capable of being raised and lowered to open and close the furnace opening 31 of the reaction tube 30, and a side heater 50 including a heating resistor capable of controlling heating of the inside of the reaction tube (furnace) 30 to a predetermined temperature (e.g., 300 to 1,200° C.). A wafer boat 60 is provided inside the reaction tube 30 to support wafers W, and below the wafer boat 60, a lower heater 70 is provided as a heating unit for heating the wafers W and keeping the wafers W warm from the lower side. The wafer boat 60 is a substrate supporting member for supporting substrates such as wafers W. In the wafer boat 60, a plurality of wafers W may be arranged and supported in a substantially horizontal state at a predetermined interval in the longitudinal direction (vertical direction). In addition, a controller 110 is provided outside the heat treatment furnace 20 to control the operation of the entire substrate processing apparatus including the substrate heating apparatus.

The wafer boat 60 and the lower heater 70 constitute the substrate heating apparatus according to the present embodiment. The other components are components of the substrate processing apparatus.

The reaction tube 30 is a single tube type reaction tube made of ceramic such as, for example, quartz glass or silicon carbide, and is a processing container configured to accommodate and process wafers W therein. An outward flange portion 32 is formed at the lower end portion of the reaction tube 30, and the flange portion 32 is held below a base plate 80 via a flange holding member 81. In this case, the reaction tube 30 penetrates the base plate 80 from below, and the side heater 50 is installed on the base plate 80.

A plurality of gas introduction pipes 90 is provided in the flange portion 32 of the reaction tube 30 to introduce a processing gas or an inert purge gas into the reaction tube 30, and the pipes of a gas supply system are connected to these gas introduction pipes 90. The top portion of the reaction tube 30 is gradually reduced in diameter, and an exhaust port 10 is formed in this top portion. The exhaust port 10 is connected to the pipes of an exhaust system that includes, for example, a vacuum pump and a pressure control valve (not illustrated) capable of controlling decompression of the inside of the reaction tube.

The lower side of the heat treatment furnace 20 is configured as a working region (loading region) in which the wafer boat 60 (to be described later) disposed on the lid 40 is carried (loaded) into the heat treatment furnace 20 (i.e., the reaction tube 30) or carried out (unloaded) from the heat treatment furnace 20 or wafers W are transferred to the wafer boat 60. In this working region 12, a lift mechanism 13 is provided to raises or lower the lid 40 so as to perform loading or unloading of the wafer boat 60.

The lid 40 is configured with, for example, a SUS (Steel Use Stainless) lid, and is held on a holding plate 15 via a plurality of shock absorbing mechanisms 14, and the holding plate 15 is connected to the lift mechanism 13. The lid 40 abuts against the open end of the furnace opening 31 to seal the furnace opening 31. In the lower central portion of the 40, a rotation introduction mechanism 100 is installed to rotate the wafer boat 60. The rotation introduction mechanism 100 includes a rotary shaft unit 101 formed of ceramics such as, for example, silicon nitride.

The wafer boat 60 is made of, for example, and includes a boat body 62 configured to support a large number of wafers W (e.g., about 20 to 150 wafers) with a large diameter (e.g., 300 mm) in a horizontal state at multiple stages in the vertical direction at intervals, and a single leg 61 configured to support the boat body 62. The boat body 62 and the leg 61 are integrally formed with each other. In addition, the single leg 61 of the wafer boat 60 is connected to the rotary shaft unit 101 to rotate the wafers W in the circumferential direction.

The boat body 62 includes a top plate 63, a bottom plate 64, and a plurality of support columns 65 configured to fix and join the top plate 63 and the bottom plate 64. The leg 61 is fixed to the central portion of the bottom plate 64. Grooves 66 are provided in the columns 65 to hold the substrates (wafers W) horizontally, and the peripheral edge portions of the wafers W are adapted to be supported by the grooves 66.

The leg 61 has a lower flange 61a protruding outward in the radial direction at the lower end portion thereof. That is, the lower portion of the leg 61 is composed of the lower flange 61a protruding outward, and the leg 61 is connected to the rotary shaft unit 101 via the lower flange 61a. In this case, the lower flange 61a and the rotary shaft unit 101 are connected by, for example, a connection pin embedded in the lower flange 61a (not illustrated).

As described above, the rotation introduction mechanism 100 includes the rotary shaft unit 101 and a cylindrical housing 102 integrally provided in the lower central portion of the lid 40 to rotatably support the rotary shaft unit 101. A rotary cylinder 103 is provided below the housing 102. A rotary shaft (not illustrated) is accommodated in the rotary cylinder 103 integrally with the rotary cylinder 103, and is provided in the rotary cylinder 103 to be rotatable via a bearing (not illustrated). A motor serving as a rotational driving unit is connected to the rotary cylinder 103 via a belt (not illustrated), so that the rotary shaft is rotated and driven.

The lid 40 includes an enclosing 41 surrounding the lower flange 61a of the leg 61 and protruding upward. The enclosing ring 41 is formed integrally with the lid 40, and a gap extending along the vertical direction is formed between the enclosing ring 41 and the lower flange 61a. The gap between the enclosing ring 41 and the lower flange 61a has a size of, for example, 0.2 mm to 2.0 mm, and the height of the enclosing ring 41 is 10 mm to 40 mm.

In order to suppress a corrosive processing gas from infiltrating into the rotary shaft unit 101 side, the lid 40 is configured to introduce an inert gas such as, for example, nitrogen gas (N2), from the gap between the enclosing ring 41 and the lower flange 61a of the lid 40. In this way, it is possible to introduce the inert gas into the reaction tube 30 from the gap between the enclosing ring 41 and the lower flange 61a of the lid 40, as required, during a process.

The side heater 50 may have various configurations as long as it can heat the reaction tube 30 from the outer surface. The side heater 50 may be configured by arranging, for example, a plurality of linear heating elements along the longitudinal direction of the reaction tube 30 so as to surround the side portion of the reaction tube 30. In this case, specifically, a large number of linear heating elements are arranged at intervals on the order of several centimeters. The linear heating elements may be arranged on a straight line in the longitudinal direction of the reaction tube 30, or a plurality of linear heating elements bent in a U shape may be arranged to surround the reaction tube 30.

The linear heating elements may be configured by disposing a carbon wire formed by knitting a plurality of high-purity linear flexible resistance heating elements, for example, carbon wire bundles having a wire diameter of about 10 μm, into a ceramic tube having an outer diameter of ten and several millimeters such as a straight tubular quartz tube, and sealing the ends of the ceramic tube such that a terminal for power supply to the outside can be connected to the ceramic tube. Such a linear heating element is characterized in that, due to small thermal capacity, a dynamic temperature characteristic thereof is excellent, rapid temperature rise or fall is enabled, and rapid temperature rise or fall is also easy to control.

The side heater 50 is powered and driven under the control of the controller 110. At this time, the same electric power may be supplied to the entire side heater 50 and controlled, or the side heater 50 may be divided into a plurality of groups and different powers may be supplied to respective groups such that the calorific values of the plurality of groups are controlled separately. Alternatively, the plurality of side heaters 50 may be driven by being connected to each other in series and connected to a power supply device, or may be driven by being connected to each other in parallel.

A lower heater 70 which is a furnace opening heat retention unit having a heat retention space 69, 79 is fixedly provided on the lid 40. The lower heater 70 is a unit provided below the wafer boat 60 to heat the wafers W and keep the wafers W warm from the lower side. The lower heater 70 includes a plurality of support columns 75 erected on the upper surface of the lid 40 at appropriate intervals in the circumferential direction, a flat planar heating element 71 provided horizontally at the upper end portions of these support columns 75, and a side portion 72 extending downward from the outer peripheral end of the planar heating element 71. By including the side portion 72 extending downward from the outer peripheral end portion of the planar heating element 71 thereof such that the heat generated from the planar heating element 71 does not escape from the side and the lower side, the lower heater 70 efficiently retains heat generated from the planar heating element 71, reliably heats the wafers W and reliably keeps the wafers W warm from the lower side.

In addition, the lower heater 70 may include a plurality of (e.g., two) heat reflectors 76 placed on the columns 75 at predetermined intervals below the planar heating element 71, as required. The columns 75 and the heat reflectors 76 are made of, for example, quartz. A through hole 77 is formed in the planar heating element 71 and the heat reflectors 76, and the leg 61 including the lower flange 61a passes through the through hole 77. A conduit 78 configured to conduct therethrough a cable for supplying electricity to the planar heating element 71 is provided in a state the state of airtightly penetrating the lid 40 from the holding plate 15. Details of the configuration of the lower heater 70 will be described later.

On the lid 40, a cylindrical shielding body 42 is provided to surround the leg 61 from the outside. The cylindrical shielding body 42 surrounds the leg 61, in particular, the lower flange 61a from the outside, and prevents a processing gas introduced from the gas introduction pipe 90 into the reaction tube 30 from infiltrating into the rotary shaft unit 101 from the gap between the enclosing ring 41 of the lid 40 and lower flange 61a of the leg 61.

The cylindrical shielding body 42 is formed so as to be easily positioned by an inclined surface provided on the outer periphery of the enclosing ring 41. That is, the outermost diameter of the enclosing ring 41 is set to be slightly smaller than the inner diameter of the cylindrical shielding body 42.

Next, the configuration of the lower heater 70 will be described in more detail.

Figure 2:
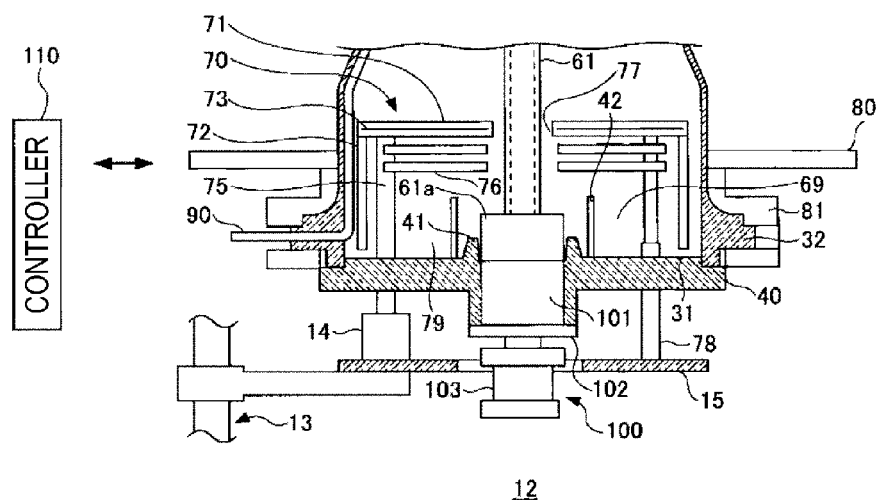
FIG. 2 is a view illustrating an exemplary lower heater of a substrate heating apparatus according to a first embodiment of the present disclosure.

FIG. 2 is a view illustrating an exemplary lower heater of a substrate heating apparatus according to a first embodiment of the present disclosure. As illustrated in FIG. 2, the lower heater 70 has a planar heating element 71 and a side portion 72. In addition, the planar heating element 71 has, for example, a linear resistance heating element 73 therein. FIG. 2 illustrates an example in which the linear resistance heating element 73 is provided inside the planar heating element 71. However, this is merely an example, and the heating element may be configured as another type of heating element and heating means.

As described above, the lower heater 70 is disposed in order to suppress the heat from being dissipated downward from the bottom plate 64 of the wafer boat 60 disposed inside the reaction tube 30 and to suppress the temperature from lowering in the lower portion of the wafer boat 60. Therefore, the lower heater 70 includes a disk-shaped planar heating element 71 or a plurality of heating elements arranged along the plane of the bottom plate 64 of the wafer boat 60. The lower heater 70 has an opening in the central portion thereof, and the leg 61 is inserted therethrough to support the wafer boat 60. Although the planar heating element 71 has a planar shape predetermined depending on the application thereof, the shape may be appropriately changed depending on the shape of the processing container and the planar shape of the wafer W. For example, the planar heating element 71 may have, for example, a polygonal planar shape.

However, even if only the planar heating element 71 is provided, there is no problem when the process temperature is high at a level of 700 to 800° C. However, at a process temperature in the level of 500 to 650° C. at which a process is performed in recent years, heating and heat retention of the lower side the wafer boat 60 may become insufficient. Such a low-temperature process is carried out in order to suppress a wafer W from warping. That is, the patterns formed on wafers W become more complicated than conventional ones, warpage occurs during a heat treatment, and when wafers W return to the original state thereof from the warping state after the heat treatment, the number of damaged wafers W increases. In order to prevent these problems, the low-temperature pressure is performed.

In the case of the conventionally performed high-temperature process in the level of 700 to 800° C., the planar heating element 71 sufficiently generates heat and emits light. Since the heat generated by the planar heating element 71 is emitted not only upward but also downward, for example, when a heat reflector 76 is provided below the planar heating element 71, it is possible to reflect the light and heat of the planar heating element 71 upwards and apply sufficient heat upward. However, at a temperature as low as 500 to 650° C., the planar heating element 71 becomes the state of generating heat while remaining transparent without emitting light. Then, even if the heat reflector 76 is provided below the planar heating element 71, the heat reflector 76 does not receive enough light and heat to reflect, the heat supply to the upper side may be reduced, and the effect as the lower heater may be remarkably deteriorated.

Therefore, in the substrate heating apparatus according to the present embodiment, a side portion extending downward from the outer peripheral portion of the planar heating element 71 is provided such that heat generated from the planar heating element 71 does not dissipate downward and laterally, thereby forming a heat retention space 69, 79 below the planar heating element 71.

Specifically, as illustrated in FIG. 2, the side portion 72 extends downward from the outer peripheral end of the planar heating element 71, and a substantially cylindrical heat retention space 69, 79 is formed below the planar heating element 71. This makes it possible to allow the upward heat generation of the planar heating element 71 to directly contribute to the heating of the wafers W, to retain the downward heat generation of the planar heating element 71 in the heat retention space 69, 79, and to suppress the temperature the space below the wafer boat 60 from being lowered. That is, the heat directly generated the planar heating element 71 to the wafers W is allowed to reach the wafers W (to be precise, the bottom plate 64 of the wafer boat 60) without being shielded, and the heat generated from the planar heating element 71 to the side opposite the wafers W is capable of being suppressed from being laterally dissipated by the side portion 72 and retained in the surrounding heat retention space 69, 79, so that heat can be stored. This makes it possible to use the heat generated from the upper and lower surfaces of the planar heating element 71 very efficiently for heating and heat retention, and thus it is possible to improve heating efficiency and heat retention efficiency.

From the viewpoint of uniform heat retention, the side portion 72 may be the same length over the entire circumference of the planar heating element 71. That is, for example, when the planar heating element 71 has a circular shape, the side portion 72 may extend downward by the same length over the entire circumference to form a cylindrical shape.

This is because it is possible to retain heat in the heat retention space 69, 79 uniformly over the entire circumference.

Although the length of the side portion 72 may be appropriately determined depending on the application, the side portion 72 may be formed as long as possible in a range in which the lower end is not in contact with the lid 40. This is because the heat retention effect in the heat retention space 69, 79 becomes higher as the heat retention space 69, 79 approaches the sealed space.

When an inert gas such as nitrogen is supplied from the gap between the enclosing ring 41 of the lid 40 and the lower flange 61a of the leg 61 of the wafer boat 60 as described above, the lower end of the side portion 72 is made to be spaced apart from the lid 40 because it is necessary to secure a supply route of the inert gas to the inside of the reaction tube 30. In addition, the hermeticity and heat retention effect of the heat retention space 69, 79 may be enhanced by making the length of the side portion 72 as long as possible to the extent that there is no problem in supplying the inert gas into the reaction tube 30, and shortening the distance between the upper surface of the lid 40 and the lower end of the side portion 72.

Meanwhile, when the inert gas is not supplied from the gap between the enclosing ring 41 of the lid 40 and the lower flange 61a of the leg 61 of the wafer boat 60, the length of the side portion 72 may increase until the side portion 72 comes into contact with the upper surface of the lid 40.

As described above, the shape and length of the side portion 72 may be variously configured depending on the application.

In addition, the side portion 72 may be made of a material having a high heat retention property such as, for example, quartz, opaque quartz, or silicon carbide.

Likewise, the planar heating element 71 may also have various configurations. Specifically, the planar heating element 71 may be one in which, for example, the linear resistance heating element 73 is densely arranged on a plane such that the flat surface uniformly generates heat. In the case of using the linear resistance heating element 73, the linear resistance heating element is configured by enclosing a linear resistance heating element containing less metallic impurities in a ceramic (e.g., quartz). In this example, a heating wire such as, for example, the linear resistance heating element may be made by arranging a carbon wire made of a high purity carbon material in a spiral shape or a zigzag shape in a disk-shaped body (quartz plate) made of quartz and having a thickness of about 8 mm. In addition, quartz may be interposed between heating lines adjacent to each other. In this case, heating wires are wired between spiral partition walls made of quartz. The planar heating element 71 may have a size equal to or larger than that of the wafers W in order to improve the heat retention effect. In addition, as long as the planar heating element 71 has a predetermined planar shape, the planar shape of the planar heating element 71 is not limited to the circular shape, and may be configured in various shapes depending on the application as described above. Further, the planar heating element 71 may be installed substantially parallel to the wafers W. This is because when the planar heating element 71 is installed parallel to the wafers W, it is possible to uniformly heat the surfaces of the wafers W. The planar heating element 71 may also be made of a highly heat-retaining material such as, for example, quartz, opaque quartz, or silicon carbide.

In the case where is constituted using a plurality of heating elements described above, the planar heating element 71 may be implemented by arranging heating elements having an arbitrary shape such as, for example, block-shaped heating elements along the flat surface of the bottom plate 64 of the wafer boat 60 such that the heated temperature becomes uniform.

The planar heating element 71 and the side portion 72 may be molded integrally from the beginning, or the planar heating element 71 and the side portion 72 may be separately manufactured and integrated later by welding. Various methods may be adopted for the method of manufacturing the lower heater 70 depending on the application.

When installing the planar heating element 71, the columns 75 made of quartz are provided on the lower surface side of the peripheral portion of the planar heating element 71, for example, in three parts equally divided in the circumferential direction, and these columns 75 may be fixedly inserted into the lid 40. In this case, one of the three columns 75 may be configured as a tubular conduit 78, opposite end portions of the heater wire may be collected to, for example, a location of the peripheral portion of the planar heating element 71, a pair of feeder members connected to this heater wire (e.g., a feeder line made of the same material as that of the heater wire) may be made to pass through a thin quartz tube, and the quartz tube may be caused to pass through the inside of the conduit 78, so that the feeder line may be wired outside the lid. Therefore, by connecting an external power supply unit to this feeder line, the heater wire generates heat. The remaining two support columns 75 may be tubular bodies or rod bodies, and are supported on the upper surface of the lid 40.

Below the planar heating element 71, the heat reflector 76 having an opening in the center thereof may be arranged parallel with the planar heating element 71 with a gap therebetween. The heat reflector 76 reflects the heat generated by the planar heating element 71 so as not to dissipate downward. Further, one heat reflector 76 or multiple heat reflectors may be provided. The planar heating element 71 and the heat reflector 76 may have substantially the same shape. Therefore, the heat reflector 76 has a plate shape or a fin shape.

As illustrated in FIG. 1, the planar heating element 71 and the heat reflector 76 are fixed to the lid 40 below the reaction tube via the columns 75. The heat reflector 76 can be made of, for example, opaque quartz or silicon carbide. By constituting the heat reflector 76 with a material having a large heat capacity such as, for example, opaque quartz or silicon carbide, it is possible to make the heat reflector 76 have a heat storage effect and a heat retention effect. As described above, the heat reflector 76 reflects the heat generated by the planar heating element 71 upward and also has a heat storage effect of storing heat by itself. In this sense, the heat reflector 76 functions not only as a heat reflecting means, but also as a heat retention means.

The controller 110 may control the calorific value of each of the lower heater 70 and the side heater 50 and may perform a control so as to uniformize the temperature distribution in the reaction tube 30.

Figure 3:
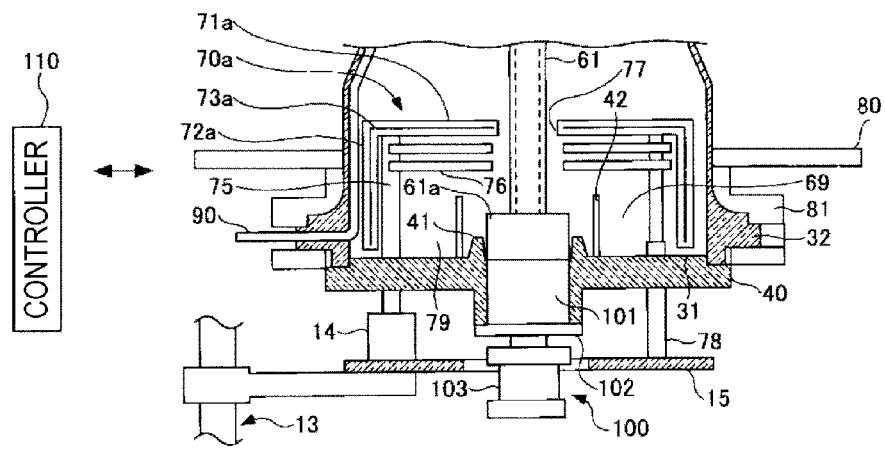
FIG. 3 is a view illustrating an exemplary lower heater of a substrate heating apparatus according to a second embodiment of the present disclosure.

FIG. 3 is a view illustrating an exemplary lower heater of a substrate heating apparatus according to a second embodiment of the present disclosure. The lower heater 70a of the substrate heating apparatus according to the second embodiment is different from the substrate heating apparatus according to the first embodiment in that the planar heating element 71a and the side portion 72a are both formed as heating elements.

As illustrated in FIG. 3, a common linear resistance heating element 73a is provided on the planar heating element 71a and the side portion 72a. In this manner, the side portion 72a may also be provided with a heating mechanism, and may be configured as heating portion or heating element. By making the side portion 72a have the heat generating function as well, it is possible to enhance the heating effect and the heat retention effect.

In addition, since the linear resistance heating element 73a may be common to the planar heating element 71a and the side portion 72a, it is possible to enhance the heating effect and the heat retention effect of the lower heater 60 without complicating the structure and the temperature control.

When a heating mechanism is provided on the side portion 72a, it may be configured in the same manner as the planar heating element 71a. Since the specific contents thereof are the same as those of the planar heating elements 71a of the first embodiment, the description thereof will be omitted.

The substrate heating apparatus according to the second embodiment is able to improve the heating efficiency and the heat retention efficiency of the lower portion of the wafer boat 60 without complicating the structure and the temperature control.

Figure 4:
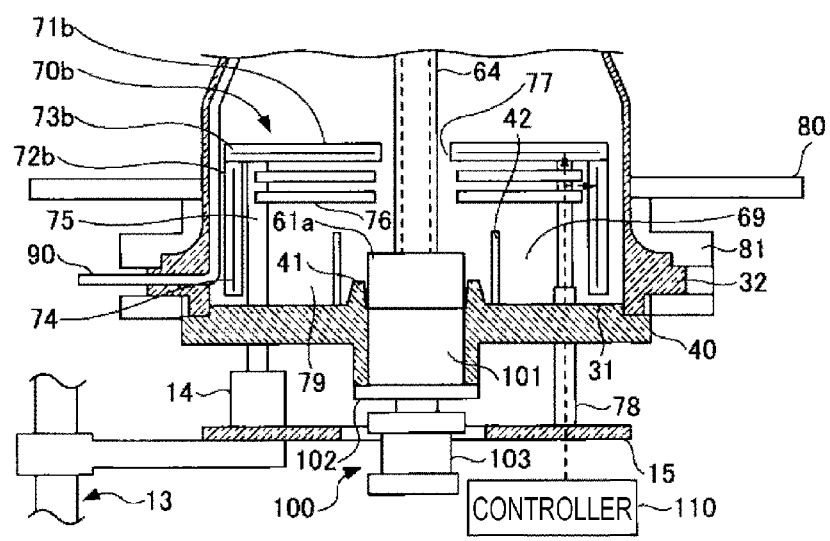
FIG. 4 is a view illustrating an exemplary lower heater of a substrate heating apparatus according to a third embodiment of the present disclosure.

FIG. 4 is a view illustrating an exemplary lower heater of a substrate heating apparatus according to a third embodiment of the present disclosure. The lower heater 70b of the substrate heating apparatus according to the third embodiment is the same as the substrate heating apparatus according to the second embodiment in that the planar heating element 71b and the side portion 72b are both configured as heating elements, but is different from the lower heater 70a of the substrate heating apparatus according to the second embodiment in that the planar heating element 71b and the side portion 72b are both made of mutually independent heating elements.

In the substrate heating apparatus according to the third embodiment, the planar heating element 71b includes a linear resistance heating element 73b, the side portion 72b includes a linear resistance heating element 74. In addition, the controller 110 is also configured to independently control the temperatures of the planar heating element 71b and the side portion 72b.

In this way, the temperatures of the horizontally provided planar heating element 71b and the side portion 72b provided on the vertical surface may be independently controlled. For example, the planar heating element 71b is set to enhance the ability to heat the wafers W from the lower side by generating a larger calorific value, and the side portion 72b is made to perform a control to reliably obtain a uniform heat retention effect with a calorific value smaller than that of the planar heat generating body 71b.

With the substrate heating apparatus according to the third embodiment, it is possible to control the temperature more flexibly depending on the process and the application while increasing the heating efficiency and the heat retention efficiency.

As described above, the substrate heating apparatus according to the present embodiment may have various configurations depending on the application. In addition, the substrate heating apparatus may be applied to various substrate processing apparatuses including any substrate heating apparatus or a vertical heat treatment apparatus.

Next, the operation of the substrate processing apparatus using the substrate heating apparatus according to the embodiments of the present invention will be described. In the following embodiments, descriptions will be made on an example in the substrate processing apparatus is configured as the vertical thermal processing apparatus 1 described with reference to FIG. 1. As the substrate heating apparatus, it is possible to apply any of the substrate heating apparatuses according to the first to third embodiments, but for ease of explanation, descriptions will be made on an example in which the substrate heating apparatus according to the first embodiment is incorporated into the vertical heat treatment apparatus 1.

The wafers W are transferred into the wafer boat 60 placed on the lid 40 in the working region 12. After the wafers W are transferred into the wafer boat 60, the lid 40 is raised by the lift mechanism 13. In addition, the lid 40 is brought into contact with the open end of the furnace opening 31 to seal the furnace opening 31.

Next, the reaction tube 30 is heated from the outside by the side heater 50, and in the inside of the reaction tube 30, the wafers W are heated from below by the lower heater 70. In the lower portion of the reaction tube 30, particularly, below the base plate 80, the side heater 50 is not provided and the temperature is likely to be lowered. The wafers W are heated from below by the lower heater 70 provided below the wafer boat 60. In the low-temperature process such as 500 to 650° C., the planar heating element 71 does generate light so much and thus reflection of heat upward from the heat reflector 76 compared to the high temperature process such as 700 to 800° C. Therefore, merely providing the planar heating element 71 and the heat reflector 76 below the wafer boat 60 increases the dissipation of heat from the side surface and the lower side. Thus, it is impossible to obtain a sufficient heat retention effect. However, in the substrate heating apparatus according to the present embodiment, since a side portion 72 extending downward from the peripheral edge of the planar heating element 71 is provided and a heat retention space 69, 79 surrounded by the planar heating element 71 and the side portion 72 is formed, it is possible to store the heat generated by the planar heating element 71 in the heat retention space 69, 79.

In addition, a processing gas is supplied into the reaction tube 30 from the gas introduction pipes 90, and a necessary heat treatment is performed on the wafers W.

During this processing, the rotary shaft 103 rotates. Due to the rotation of the rotary shaft 103, the rotary shaft unit 101 rotates, and the wafer boat 60 slowly rotates.

In addition, an inert gas (e.g., N$_2$ gas) is supplied to a gap (not illustrated) between the housing 102 and the rotary shaft 103, and the inert gas is supplied to the inside of the reaction tube 30, more specifically to the inside of the heat retention space 69, 79 by causing the inert gas to flow in the vertical direction through the gap between the lower flange 61a of the leg 61 and the enclosing ring 41 of the lid 40.

Since the inert gas is supplied into the reaction tube 30 through the gap between the lower flange 61a of the leg 61 and the enclosing ring 41 of the lid 40 during the heat treatment of the wafer W in this way, the processing gas does not flow back to the rotary shaft unit 101 side through the gap. Therefore, it is possible to reliably prevent the rotary shaft unit 101 from being corroded by the processing gas.

As described above, even when the inert gas is supplied into the reaction tube 30 via the heat retention space 69, 79, the flow of the inert gas is not disturbed when a gap is provided between the lower end of the side portion 72 and the upper surface of the lid 40. The substrate heating apparatus according to the present embodiment is capable of coping with supply of inert gas during such a heat treatment without any problem.

The cylindrical shielding body 42 provided around the enclosing ring 41 is also provided to prevent the processing gas in the reaction tube 30 from infiltrating into the gap between the lower flange 61a and the enclosing ring 41.

The substrate heating apparatus according to the present embodiment may be made to coexist with the corrosion prevention structure and function, and is capable of having two functions of corrosion prevention and efficient heat retention of the lower portion of the reaction tube 30.

The heat reflector 76 provided below the planar heating element 71 is provided from the viewpoint of heat retention. However, the heat reflector 76 is not an essential one, but may be provided as necessary. That is, when sufficient heat retention is possible in the heat retention space 69, 79 formed by the planar heating element 71 and the side portion 72, it is not always necessary to provide the heat reflector 76.

When the heat treatment of the wafers W is completed, the lid 40 is lowered, the heat-treated wafers W are unloaded, and the substrate processing is terminated.

As described above, according to the substrate heating apparatus and the substrate processing apparatus according to the present embodiment, it is possible to improve the heating efficiency and heat retention efficiency of the lower portion of the reaction tube 30, and obtain a heat retention effect of sufficiently coping with the low-temperature process as well. In recent years, in conjunction with the lowering of temperature, a process is performed under a low temperature and high pressure, but it is also possible to sufficiently cope with such a process. A process under high pressure is performed in order to increase the number of times the molecules of the processing gas collide with wafers W and to improve throughput. Conventionally, there is a request to carry out a process, which has been conventionally performed under a pressure in the level of 0.1 to 0.2 Torr, under a pressure 10 times or more, such as 2 to 2.5 Torr. According to the substrate heating apparatus and the substrate processing apparatus according to the present embodiment, it is possible to sufficiently cope with such a process, and perform a uniform heat treatment in the vertical direction of the wafer boat 60.

According to the present disclosure, it is possible to sufficiently heat a substrate from and keep the substrate warm from the lower side.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate heating apparatus comprising:
   a substrate support configured to substantially horizontally support a substrate;
   a heater provided below the substrate support substantially parallel to the substrate, and having a circular shape; and
   a side portion extending downward from an outer peripheral portion of the heater, and having a cylindrical shape having a same length over an entire circumference thereof.

2. The substrate heating apparatus of claim 1, wherein the side portion is made of opaque quartz or silicon carbide.

3. The substrate heating apparatus of claim 1, wherein the side portion includes a secondary heater.

4. The substrate heating apparatus of claim 3, wherein the heater and the secondary heater of the side portion are configured to be independently controlled in temperature.

5. The substrate heating apparatus of claim 1, further comprising:
   a heat retainer provided inside a space surrounded by the heater and the side portion, the heat retainer being made of opaque quartz or silicon carbide.

6. The substrate heating apparatus of claim 5, wherein the heat retainer is made of a plurality of plate-shaped or fin-shaped members.

7. The substrate heating apparatus of claim 1, wherein the substrate support has a structure in which a plurality of substrates is arranged and supported in a horizontal state at a predetermined interval in a vertical direction.

8. A substrate processing apparatus comprising:
   the substrate heating apparatus defined in claim 1;
   a reaction tube configured to cover the substrate support, the heater, and the side portion; and
   a side heater installed around the reaction tube and configured to heat the reaction tube.

9. A substrate heating apparatus comprising:
   a substrate support configured to substantially horizontally support a substrate;
   a first heater provided below the substrate support substantially parallel to the substrate, and having a predetermined planar shape; and
   a side portion including a second heater and extending downward from an outer peripheral portion of the first heater,
   wherein the first heater and the second heater of the side portion are configured to be independently controlled in temperature.

10. The substrate heating apparatus of claim 9, wherein the side portion is made of opaque quartz or silicon carbide.

11. The substrate heating apparatus of claim 9, further comprising:
    a heat retainer provided inside a space surrounded by the heater and the side portion, the heat retainer being made of opaque quartz or silicon carbide.

12. The substrate heating apparatus of claim 11, wherein the heat retainer is made of a plurality of plate-shaped or fin-shaped members.

13. The substrate heating apparatus of claim 12, wherein the substrate support has a structure in which a plurality of substrates is arranged and supported in a horizontal state at a predetermined interval in a vertical direction.

* * * * *